United States Patent [19]

Uhm et al.

[11] Patent Number: 5,051,659
[45] Date of Patent: Sep. 24, 1991

[54] BULK PLASMA GENERATION

[75] Inventors: Han S. Uhm, Potomac; Joel D. Miller, Laurel; Ralph F. Schneider, Burtonsville; Daniel J. Weidman, Silver Spring, all of Md.

[73] Assignee: The United States of America as represented by the Secretary of the Navy, Washington, D.C.

[21] Appl. No.: 647,903

[22] Filed: Jan. 30, 1991

[51] Int. Cl.⁵ ............................................. H05H 1/02
[52] U.S. Cl. ........................... 315/111.41; 315/111.21; 315/111.71; 313/231.31; 250/427
[58] Field of Search ................... 315/111.21, 111.41, 315/111.71, 111.81; 313/231.31; 250/423 R, 427

[56] References Cited

U.S. PATENT DOCUMENTS

| | | | |
|---|---|---|---|
| 4,447,732 | 5/1984 | Leung et al. | 315/111.81 X |
| 4,661,710 | 4/1987 | Verney et al. | 250/427 X |
| 4,742,232 | 5/1988 | Biddle et al. | 250/427 |
| 4,767,931 | 8/1988 | Sato et al. | 250/423 R |
| 4,857,809 | 8/1989 | Torii et al. | 315/111.31 |

Primary Examiner—Eugene R. LaRoche
Assistant Examiner—Do H. Yoo
Attorney, Agent, or Firm—Kenneth E. Walden; Jacob Shuster

[57] ABSTRACT

Annular arrangements of thermionic filaments adjacent opposite axial ends of a chamber within which argon gas at low presure is confined, generate steady state plasma with uniformity by low energy emission of gas ionizing electrons from the filaments. The ionizing electrons and plasma generated are axially confined between grids at the axial ends of the chamber and radially confined by a low intensity magnetic field generated by an external magnetic coil.

10 Claims, 3 Drawing Sheets

BULK PLASMA GENERATION

BACKGROUND OF THE INVENTION

This invention relates generally to the generation of plasma within enclosed or confined volumes.

The generation of a steady state bulk plasma has recently received renewed interest for various purposes including basic plasma physic studies as well as use in commercial processes calling for generation of relatively large quantities of the plasma with uniformity and predictable properties.

The generation of plasma by ionization of low pressure gas within a cylindrical chamber, to which the plasma is radially confined by the magnetic field of a surrounding magnetic coil, is already well known in the art, as disclosed for example in U.S. Pat. Nos. 4,742,232, 4,745,338, 4,767,931, 4,810,935 and 4,857,809 to Biddle et al., Hollis, Jr., et al., Sato et al., Boswell and Torii et al., respectively. According to the Torii et al. patent, radial confinement of the magnetic field establishes narrow high density portion of the plasma along the axis of the cylindrical chamber. Axial confinement of plasma is effected by repelling grids at the axial ends of the chamber according to the Biddle et al. patent. The Biddle et al. patent as well as the Sato et al. patent disclose an electron emitting filament adjacent to one axial end of the chamber to ionize the gas therein for generation of the plasma.

The foregoing prior art patents fail to disclose or suggest effective techniques for obtaining uniformity in the plasma density along the axis of the gas ionization chamber to facilitate the determination of such plasma density with changes in plasma generating parameters such as magnetic field intensity and filament discharge current.

It is therefore an important object of the present invention to provide for the generation of relatively large quantities of plasma with uniform and predictable densities in its steady state.

SUMMARY OF THE INVENTION

In accordance with the present invention, steady state bulk plasma is generated within a cylindrical drift chamber by direct ionization of a neutral low pressure gas in the chamber. Ionization is effected by emission of low energy electrons from heated tungsten filaments which are biased with respect to a grounded chamber housing at a variable discharge voltage level that is independent of the plasma density. The filaments are arranged in annular configurations adjacent to opposite ends of the chamber and the electrons emitted therefrom are radially confined by an axially extending magnetic field of low intensity to provide axial uniformity of the bulk plasma density. The electrons emitted from the filaments are axially confined between reflecting grids disposed between the annular filament assemblies and the housing end walls at opposite axial ends of the chamber. The resultant steady state plasma is of substantially constant maximum density along the chamber axis within a radially inner zone determined by the inner radius of the filaments. Plasma density decreases radially outward from the filaments approaching zero at the radially outer chamber wall of the housing. Further, the plasma density may be varied as predictable functions of the radially confining magnetic field intensity, density of the neutral gas in the chamber and electron discharge current.

BRIEF DESCRIPTION OF DRAWING FIGURES

A more complete understanding of the invention and many of the attendant advantages thereto will be readily appreciated as the same becomes better understood by reference to the following detailed description when considered in connection with the accompanying figures wherein.

DETAILED DESCRIPTION OF PREFERRED EMBODIMENT

Figure 1:
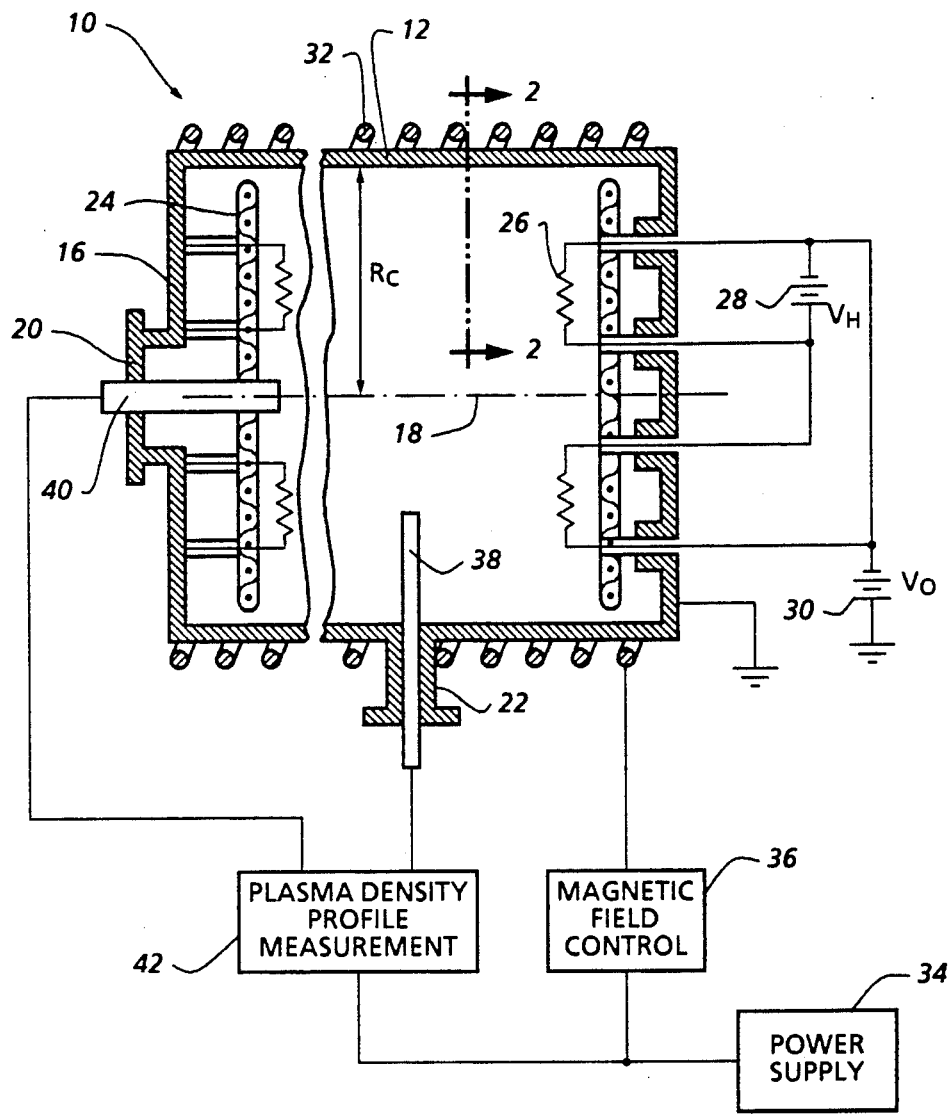
FIG. 1 is a schematic partial side section view and circuit diagram of apparatus for generation of bulk plasma in accordance with one embodiment of the invention.
Figure 2:
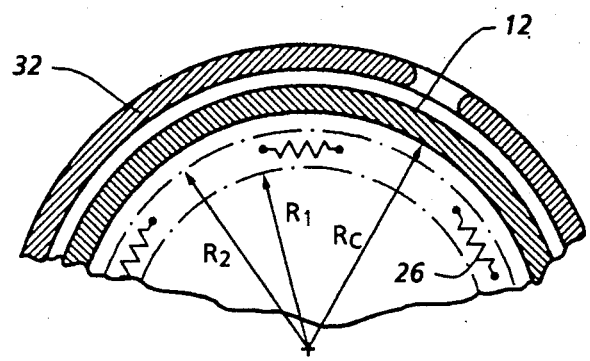
FIG. 2 is a partial transverse section view taken substantially through a plane indicated by section line 2—2 in FIG. 1.

Referring now to the drawing in detail, FIGS. 1 and 2 depict a bulk plasma generating device in accordance with one embodiment of the invention, generally referred to by reference numeral 10. The device generates a body of steady state plasma within a cylindrical chamber enclosed by a housing 12 made of aluminum or stainless steel. The housing is closed at opposite axial ends by end walls 14 and 16 intersected by the geometric axis 18 of the enclosed cylindrical chamber. Openings are formed in the end walls for extension of electrical wiring therethrough as will be explained hereinafter. Suitable probe mounting formations 20 and 22 are provided on the end wall 16 and the cylindrical wall of the housing as will also be explained hereinafter.

Mesh grids 24 are positioned within the housing chamber in parallel spaced adjacency to the end walls as shown in FIG. 1 for the purpose of reflecting electrons. Electrons are injected into a body of neutral gas, such as argon, retained within the housing chamber, the electrons being emitted from arrays of thermionic tungsten filaments 26, which are circumferentially spaced from each other as shown in FIG. 2. Each of the arrays is located axially adjacent to one of the grids 24 as shown in FIG. 1. The neutral argon gas is introduced into the housing and maintained at low pressure therein between $10^{-3}$ and $10^{-5}$ Torr by suitable means (not shown) well known in the art. The filaments 26 positioned within the chamber emit electrons in order to ionize the body of argon gas. The electrons are axially confined to an ionization region within the housing chamber by reflections from the grids.

In accordance with the present invention the filaments 26 are arranged in their aforementioned annular arrays about the chamber axis 18. In the illustrated embodiment, six of such filaments 26 are provided for each axial of the annular arrays adjacent the ends of the cylindrical chamber. The filaments in each of the arrays are circumferentially spaced from each other by equal amounts and radially spaced from axis 18 by equal amounts. The circular arrangements of filaments 26 as shown adjacent the opposite axial ends of the cylindrical housing chamber thus define a radially inner cylindrical zone of radius ($R_1$) corresponding to the inner end of the filaments and a radially outer annular zone between the outer end of the filaments of radius ($R_2$) and the radially outer wall of the cylindrical chamber of radius ($R_c$) as denoted in FIG. 2.

With reference to FIG. 1, the filaments 26 are rendered operative to emit gas ionizing electrons into the ionization region by a DC heating voltage ($V_H$) applied thereacross from a suitable voltage source 28, while a predetermined DC voltage differential ($V_o$) is maintained by source 30 between the filaments and the housing 12, or ground where the housing is grounded as shown. A differential voltage ($V_o$) of $-70$ volts was maintained for example during experimental testing.

As also shown in FIG. 1, a magnetic coil 32 is externally mounted about the housing 12 and extends axially between its opposite axial ends to generate a magnetic field of relatively low intensity when energized from a power supply 34 through suitable field control 36. The magnetic coil 32 is thereby rendered operative to radially confine the ionizing electrons emitted from filaments 26 to the body of argon gas within the ionizing region of the housing chamber. The magnetic coil 32 in cooperation with the electron repelling grids 24 and the filament assembly configuration is effective to not only provide the desired axial and radial confinement for the ionizing electrons but also confine a body of plasma in a steady state which is generated as a result of the ionization of the argon gas. By virtue of such plasma confining action, uniform distribution of steady-state plasma density in both radial and axial directions is established pursuant to the discoveries of the present invention as evident from experimental data collected. Collection of such data was effected through microwave resonator and Langmuir probes 38 projecting radially into the housing through mounting formations 22, together with a Langmuir probe 40 projecting axially into the housing through formation 20 in end wall 16 as shown in FIG. 1. The probes 38 and 40 are connected to plasma density diagnostic equipment 42, as diagrammed in FIG. 1, for density profile measurement purposes in accordance with techniques generally well known in the art, the details of which form no part of the present invention.

Figure 3:
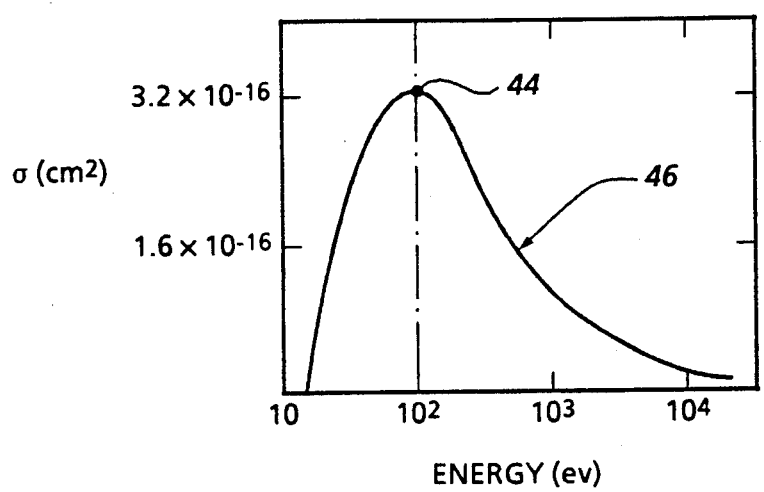
FIG. 3 is a graphical representation of argon gas ionization versus electron energy.

The discoveries of the present invention resulted from plasma density data collected in apparatus 10 based on a geometrical dimensional factor determined from the radius ($R_c$) and the inner and outer radii ($R_1$) and ($R_2$) of the electron emitting filament arrangements aforementioned. Also, data collection was associated with the maintenance of an optimum differential voltage ($V_o$) between the grounded housing 12 and the filaments 26 at an approximately 100 eV electron energy level corresponding to maximum ionization of the neutral argon gas. Such maximum ionization is denoted by point 44 on curve 46 of FIG. 3 plotting the ionization cross-section of the neutral argon gas against the energy level of the electron emitting filaments 26. The geometrical dimensional factor (G) utilized in connection with the ionization measurements was based on the formula:

$$G = 1 + 2\ln\left[\frac{R_c}{R_2}\right] + \frac{2R_1^2}{R_2^2 - R_1^2}\ln\left[\frac{R_1}{R_2}\right].$$

Where $R_c = 25$ cm, $R_1 = 14$ cm and $R_2 = 19$ cm in one embodiment, the dimensional factor (G) was determined to be 0.85 from the foregoing formula.

Figure 4:
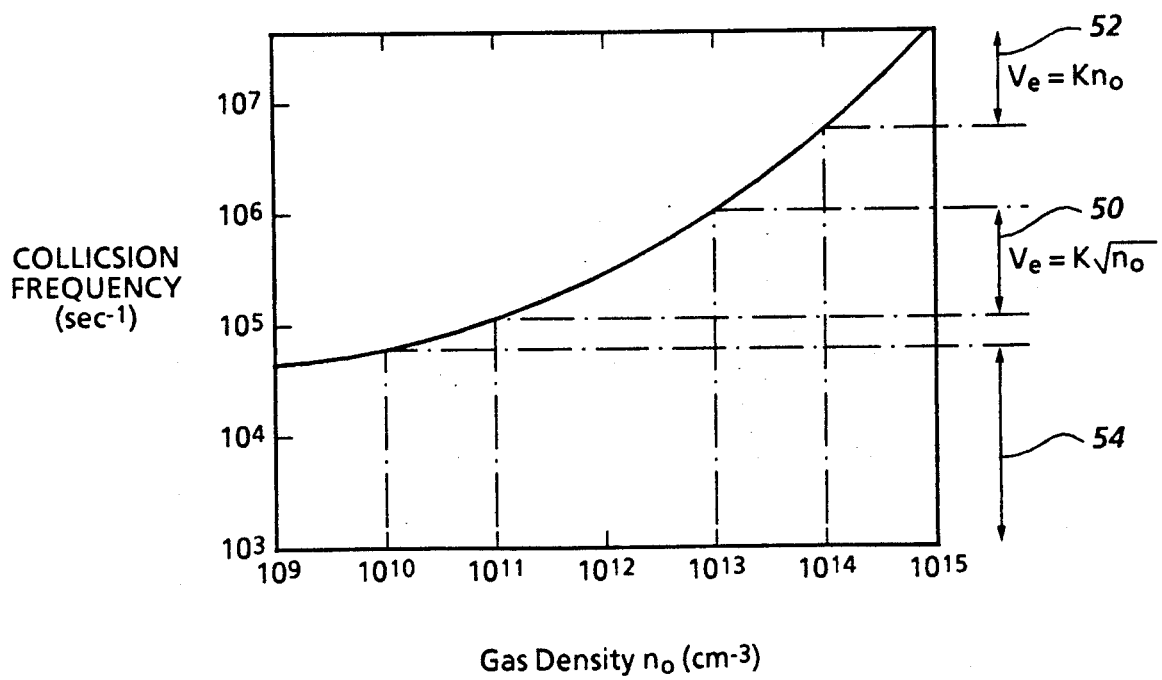
FIG. 4 is a graphical representation of electron collision frequency versus the density of the neutral argon within the chamber of the apparatus.

It has been shown that in the determination of plasma density, electron collision frequency plays a pivotal role, where the filaments 26 act as a cathodes from which the electrons are emitted and accelerated, by the plasma in its steady state acting as an anode, toward the center of the housing chamber. Electron collision frequency (e) is related to the density ($n_o$) of neutral argon gas, as determined from a collision frequency mode under an external radially confining magnetic field of intensity 2G, as shown by curve 48 in FIG. 4. It will be observed from curve 48, that in the field density range 50, where $10''\text{ cm}^{-3} < n_o < 10^{13}\text{ cm}^{-3}$, electron collision frequency is proportional to the square root of the neutral field density ($e = K\sqrt{n_o}$). In the range 52, where $n_o > 10^{14}\text{ cm}^{-3}$, collision frequency is proportional to field density ($e = Kn_o$). Where the neutral field density ($n_o$) is under $10^{10}\text{ cm}^{-3}$, the electron collision frequency is in a range that is substantially independent of the field density ($n_o$) as reflected by curve 48 in FIG. 4. The rather complex combination of processes involved in the electron collision frequency phenomenum represented by curve 48 is a graphical presentation of a collision frequency model characterized by the uniformity of the density achieved with respect to the steady state plasma as evidenced from the density profile curves plotted in FIGS. 5 and 6 under approximately maximum neutral ionization density of the argon gas and a geometrical configuration reflected by the dimensional factor $G = 0.85$ as aforementioned.

Figure 5:
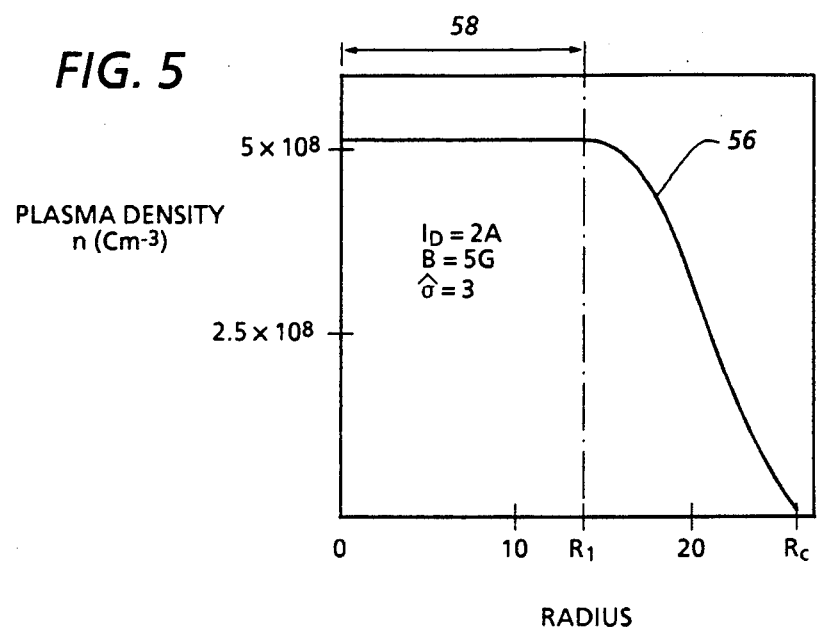
FIG. 5 is a graphical radial profile of plasma density within the apparatus chamber.

The density profile of the steady state plasma in a radial direction is shown by curve 56 in FIG. 5, where the magnetic field intensity (B) of the magnetic coil 32 is 5 gauss and the discharge current ($I_D$) from the filaments 26 acting as a cathode is 2 amperes. From both theory and experimental data obtained from the Langmuir probes, as depicted along portion 58 of curve 56 in FIG. 5, the radial plasma density (n) remains substantially constant in the inner radial zone where the radial distance (r) from the axis 18 of the housing chamber is less than $R_1$. The radial density (n) decreases to zero thereafter as the radial distance (r) approaches $R_c$ as shown in FIG. 5. The density profiles of the steady state plasma under the same geometrical configuration and neutral gas ionization density is shown by the curves 60, 62 and 64 in FIG. 6, obtained from measurements along the axis 18 found to be almost uniform therealong. The other common parameters associated with all of the plasma density profiles are determined for plotting of curve 62 as plasma density ($n_p$) vs. a varying magnetic field intensity (B) generated through coil 32, as indicated along abscissa scale 66 in FIG. 6. In plotting curve 62, the discharge current ($I_D$) was 3 amperes and the neutral gas density ($n_o$) was $7.12 \times 10^{12}\text{ cm}^{-3}$ at the center of the housing chamber. Curve 60 exhibits plasma density ($n_p$) as a function of the magnetic field intensity (B) as expected.

Figure 6:
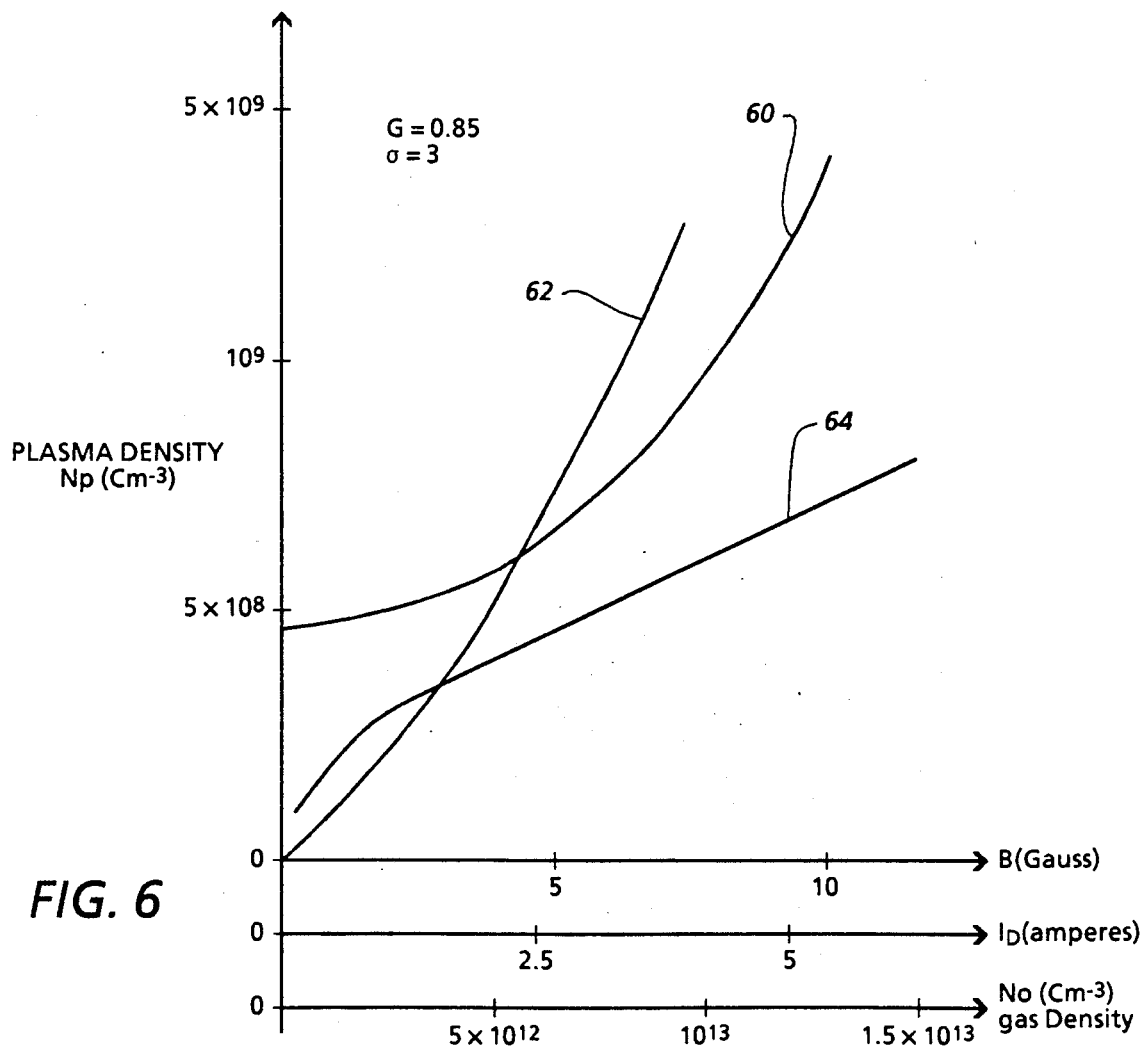
FIG. 6 is a graphical representation of plasma density versus various plasma generating variables, consisting of radially confining magnetic field intensity, electron discharge current and neutral argon density.

Plasma density ($n_p$) at the axis 18 of the housing chamber varies as a function of discharge current ($I_D$), indicated on abscissa scale 68, as exhibited by curve 62 in FIG. 6. Thus, it is observed from curve 62 that plasma density ($n_p$) is proportional to the four-thirds power of discharge current ($I_D$) where ($n_p = K I_D^{4/3}$). Curve 64, on the other hand, is a plot of plasma density at axis 18 varying as a function of the density ($n_o$) of the neutral gas in the chamber of the housing along abscissa scale 70 for a discharge current ($I_d$) of 1 ampere. From curve 64, it is observed that plasma density ($n_p$) is proportional to the two-thirds power of neutral gas density ($n_o$). Also, from experimental data it was found that the plasma density is almost independent of discharge voltage of the thermonic filaments 26 during variation between 50 and 100 volts, consistent with the argon ionization properties as reflected by curve 46 of FIG. 3.

From the forgoing description, it will be apparent that a relatively large volume of steady state plasma may be generated with uniformity in its density both in radial and axial directions within a closed cylindrical chamber region to which it is confined axially by reflections from axially spaced electron repelling grids 24 and radially by the low intensity magnetic field generated through the magnetic coil 32. Based on the electron collision frequency profile exhibited by curve 48 in FIG. 4, the uniform plasma density along axis 18 may be determined as predictable functions of the external magnetic field intensity (B), discharge current ($I_D$) and neutral density ($n_o$) of the ionized argon gas as respectively exhibited by the curves 60, 62 and 64 of FIG. 6.

Obviously, numerous modifications and variations of the present invention are possible in light of the above teachings. It is therefore to be understood that within the scope of the appended claims the invention may be practiced otherwise than as specifically described herein.

What is claimed is:

1. In a device for generating steady state plasma, including a housing having opposite axial ends between which an axis extends longitudinally through a body of gas ionized by electrons, electron repelling grids positioned within the housing adjacent the axial ends thereof and magnetic coil means positioned externally on the housing for producing a magnetic field confining the electrons in cooperation with the electron repelling grids to form an electron confinement region within the housing, the improvement residing in confinement of the plasma to said region within the housing between said opposite axial ends thereof and means mounted in operative relation to the repelling grids and the magnetic coil means for emitting the electrons producing said steady state plasma with a density that is uniform along said axis within the electron confinement region.

2. The improvement as defined in claim 1 wherein said electron emitting means includes a plurality of filaments arranged in annular relation to the axis to define a radially inner zone within which the density of the steady state plasma is of a substantially constant maximum value along the axis.

3. The improvement as defined in claim 2 wherein said filaments further define a radially outer zone within the housing within which the density of the steady state plasma decreases from said substantially constant maximum value toward zero.

4. The improvement as defined in claim 1 wherein said electron emitting means includes a plurality of filaments arranged in annular relation to the axis to define a radially outer zone within the housing within which the density of the steady state plasma decreases toward zero.

5. The improvement as defined in claim 1 including energizing means connected to the magnetic coil means and the electron emitting means for varying the density of the steady state plasma within the confinement region a predictable functions of intensity of said magnetic field and discharge current from the electron emitting means.

6. The improvement as defined in claim 5 wherein said electron emitting means includes a plurality of filaments arranged in annular relation to the axis.

7. A device for generating steady-state bulk plasma, comprising a housing enclosing a drift chamber, a body of gas under pressure within said chamber, axially spaced arrays of filaments operatively mounted within the chamber in predetermined radial relation thereto, power means connected to said filaments for emitting energy electrons initiating formation of plasma by ionization of said body of gas and magnetic field means radially confining the electrons emitted from the filaments for rendering the plasma uniform in density between said arrays and radially inward of the filaments while decreasing in density toward zero radially outwardly of the filaments within the chamber.

8. The device of claim 7 wherein said gas is argon under said pressure within the chamber which varies between $10^{-4}$ and $10^{-5}$ Torr.

9. The device of claim 8 wherein said filaments in each of the arrays are circumferentially spaced and further including electron repelling means in axial adjacency to said filaments for axially confining the electrons emitted between the arrays.

10. The device of claim 7 wherein said filaments in each of the arrays are circumferentially spaced and further including electron repelling means in axial adjacency to said filaments for axially confining the electrons emitted between the arrays.

* * * * *